United States Patent
Hernandez Manchola

(10) Patent No.: US 10,466,308 B2
(45) Date of Patent: Nov. 5, 2019

(54) FAULT LEVEL ESTIMATION METHOD FOR POWER CONVERTERS

(71) Applicant: SIEMENS AKTIENGESELLSCHAFT, Munich (DE)

(72) Inventor: Alvaro Jose Hernandez Manchola, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 430 days.

(21) Appl. No.: 15/305,364

(22) PCT Filed: May 12, 2014

(86) PCT No.: PCT/EP2014/059655
§ 371 (c)(1),
(2) Date: Oct. 20, 2016

(87) PCT Pub. No.: WO2015/172810
PCT Pub. Date: Nov. 19, 2015

(65) Prior Publication Data
US 2017/0045589 A1   Feb. 16, 2017

(51) Int. Cl.
| | |
|---|---|
| *G01R 31/42* | (2006.01) |
| *H02M 5/44* | (2006.01) |
| *H02M 1/32* | (2007.01) |
| *H02H 3/00* | (2006.01) |
| *H02H 7/12* | (2006.01) |
| *H02J 3/36* | (2006.01) |

(52) U.S. Cl.
CPC .............. *G01R 31/42* (2013.01); *H02H 3/006* (2013.01); *H02H 7/1216* (2013.01); *H02J 3/36* (2013.01); *H02M 1/32* (2013.01); *H02M 5/44* (2013.01); *Y02E 60/60* (2013.01)

(58) Field of Classification Search
CPC ......... G01R 31/42; H02H 7/12; H02H 7/1216
See application file for complete search history.

(56) References Cited

U.S. PATENT DOCUMENTS

| | | | |
|---|---|---|---|
| 5,625,751 A | 4/1997 | Brandwajn et al. | |
| 2003/0139908 A1* | 7/2003 | Wegerich ........... | G05B 23/0254 702/183 |

(Continued)

FOREIGN PATENT DOCUMENTS

| | | |
|---|---|---|
| CN | 101895125 B | 11/2012 |
| CN | 103364683 A | 10/2013 |

*Primary Examiner* — Mohamed Charioui
(74) *Attorney, Agent, or Firm* — Laurence Greenberg; Werner Stemer; Ralph Locher

(57) ABSTRACT

A method for fault level estimation for a power converter quickly after a fault clearing event includes a step of providing a training dataset with an input variable set and a corresponding system fault level output variable. The method further includes a step of deducing a hypothesis function based on the training dataset and estimating the system fault level quickly after the fault clearing event using the hypothesis function. The hypothesis function is deduced either using a neural network computational model or using a multivariate polynomial regression approach. The estimated fault level can then be used to adjust the controller parameters of the power converter.

15 Claims, 2 Drawing Sheets

(56) References Cited

U.S. PATENT DOCUMENTS

2006/0074558 A1* 4/2006 Williamson ......... G01C 21/165
  701/469
2007/0055392 A1* 3/2007 D'Amato ............. G05B 13/048
  700/44

* cited by examiner

FAULT LEVEL ESTIMATION METHOD FOR POWER CONVERTERS

BACKGROUND OF THE INVENTION

Field of the Invention

The present invention relates to a method for estimating the fault level for a power converter system and more particularly a method for fault level estimation for a power converter quickly after a fault clearing event.

Automatic gain adjustment is a very useful feature which allows power electronic converters, or simply power converters, to adjust their controller parameters in order to provide a better performance during system dynamics. Controller parameters can be for example, gains and time constants within Proportional-Integral-Derivative controllers. These power converters are used for example in high voltage DC transmission (HVDC) systems, Static Var Compensators (SVC), Type 4 (Full Converter) and Type 3 doubly fed induction generator (DFIG) wind turbines.

So far automatic gain adjustment has been used by some power converter systems where the controller parameters of the power converter could be adjusted based on measurements started during the steady state. For this a small amount of reactive current is injected during the operation of the converter which causes a slight voltage deviation in the system. The reactive power (Q) and the actual voltage (V) at the converter terminal are measured before, during and after the modification in the reactive current. From these measurements ($\Delta V/\Delta Q$) an estimate of the fault level is obtained, and with it the controller parameters are modified.

As mentioned above, the measurements used by the existing automatic gain adjustment are started during the steady state system conditions and therefore immediately after a severe contingency event, for example a system fault, the usefulness of the information provided by the automatic gain adjustment is questionable because system faults are normally cleared through transmission line/transformer/generator protection equipment trips which have an influence on the system fault level. In other words, the system short circuit level immediately after a fault which has been cleared by the tripping of important equipments, like transmission lines, generators, transformers etc., is unknown to the power electronic converter controllers. After the said fault clearing event the system condition, for example the strength of the bus bars, changes significantly and hence the converter controller parameters are no longer optimal for the new system condition.

Not having a reliable estimate of the system fault level some milliseconds after the fault clearing event is the cause of below optimal performance behavior in power electronic converters.

In case of classical line commutated converter (LCC) HVDC 12 pulse bridge inverter, not having a reliable fault level estimation, shortly after a fault clearing event, can lead to repetitive commutation failure during DC power recovery after fault clearing. This is due to the fact that after the fault clearing event the HVDC tries to recover to its pre-fault DC power, regardless of what the new system condition post fault clearing is.

The use of steady state automatic gain adjustment, which is already in use in certain SVC-STATCOM (Static VAR Compensation) systems, has dealt with the dynamic performance issues in case of non-severe contingencies, i.e. contingencies that do not influence or have little influence on the system fault level.

Another way in which generally adequate dynamic system performance is obtained is through use of robust controller parameters resulting from extensive investigations and very long system studies. These controller parameters are tested in a number of scenarios and system fault levels.

For a classical 12 pulse bridge HVDC inverter, in order to avoid repetitive commutation failures during DC power recovery after clearing of an AC fault, DC power modulation or runbacks are triggered by external signals that are sent to the converter station some milliseconds after the clearing event. These external signals are normally based on the status of important transmission lines in substations nearby the converter stations. These external signals are sometimes not reliable, or it is sometimes not possible to send them on time, for example in 100 ms or lesser, for the converter control to initiate the runback of DC power.

There is no known method for quickly and correctly estimating the system fault level quickly after the fault has been cleared. The methods known are either for estimating the fault level during a steady state condition, or the methods are time consuming and based on extensive research or the methods are unreliable.

Therefore there is a need for a quick, reliable and effective method that correctly estimates a fault level quickly after a fault clearing event in a power converter.

BRIEF SUMMARY OF THE INVENTION

It is an object of the present invention to provide a method for fault level estimation for a power converter very quickly after a fault clearing event.

The object of the invention is achieved by a method which comprises the steps of providing a training dataset comprising an input variable set ($X=[X_0\ X_1\ X_2\ \ldots\ X_n]$) and a corresponding system fault level output variable (y), deducing a learning or a hypothesis function ($h_\theta(x)$) based on the training dataset and estimating the system fault level quickly after the fault clearing event using the hypothesis function ($h_\theta(x)$).

The training dataset is a sample set of data which is used to train the method to predict the output in future circumstances once the method is trained. This is a form of supervised learning.

Supervised learning is the machine learning task of inferring a function from labeled training data. The training data consists of training examples. The training examples consist of an input vector (features "X") and its associated correct output value ("y"). The task of a supervised learning method is to analyze the training data and come up with a hypothesis function $h_\theta(x)$, which can be used for mapping new examples, i.e $h_\theta(x) \approx y$ for all training examples.

In this invention the task of such a supervised learning method is to create a hypothesis function $h_\theta(x)$ that accurately estimates the fault level (y) shortly after the fault clearing event based on a training dataset made up of selected input vector "features X" and their corresponding output (y) i.e. the short circuit level.

In one embodiment of this invention the method is used for adjusting the controller parameters of the power converter based on the system fault level estimation. The adjusting of controller parameters based on correct fault level estimation provides improved system performance and better response to the changed system conditions after the fault clearing event. Using the information of estimated fault level, the strength of the system, for example the strength of bus bars, can be correctly gauged and the converter controller can then accordingly adjust to the new system conditions post the fault clearing event and an improved dynamic performance of the power converter can be achieved.

One of the challenges of employing the supervised learning method in the form of an artificial intelligence technique, which quickly and accurately estimates the fault level after the fault clearing event, is to identify the appropriate "features X" to use as an input to the supervised learning method. In one embodiment of the method the input variable set ($X=[X_0\ X_1\ X_2\ \ldots\ X_n]$), or "features X", is derived from voltage measurements (V) and reactive power exchange measurements (Q) after the fault clearing event.

The supervised learning algorithms presented in this invention, allow for fast transient and accurate fault level estimation shortly after a fault clearing event, even in presence of highly non-linear power electronic equipment like HVDC LCC converters, wind turbines and STATCOM.

According to one embodiment of the method the fault event is detected by an under-voltage condition. The proposed "features X" described above involve measurements after the fault clearing event, therefore some form of fault detection is required so that once the fault is cleared the measurements required for the input "features X" can start. This invention proposes the use of an under-voltage condition detection, for example when voltage V≤0.8 pu, to flag a fault incident in the AC network and trigger the neural network fault level estimation method quickly after fault clearing event takes place. Under-voltage condition is only one of many factors to detect a fault. Other factors that can be used for detecting a fault can be over-voltage, over-current, under-current, or other similar monitorable conditions. Under-voltage condition provides for a simple and easy fault detection method.

In an embodiment of the method the voltage measurements (V) and the reactive power exchange measurements ($Q_{ex}$) are measured at a desired bus bar connected to the power converter. The voltage measurements (V) can be directly taken from a contact point on the bus bar. The same voltage measurements as the one used for the converter voltage controller is appropriate. Positive sequence fundamental frequency voltage measurements may be used as an alternative. Reactive power is a function of a circuit's reactance therefore the reactive power exchange measurements ($Q_{ex}$) can't be measured directly but need to be calculated from the voltage measurements and the reactance of the circuit where the power converter is connected. It can also be calculated from the apparent and real power measurements. The reactive power exchange ($Q_{ex}$) with the network measurements together with the voltage measurements (V) at the desired bus bar forms the input "features X" for the disclosed method.

For this invention two alternative supervised learning methods have been proposed namely, a polynomial multivariate regression method and a method using neural network computational model. The neural network computational model is a preferred embodiment of the method as it gives better accuracy and better overall performance as compared to the method using polynomial multivariate regression.

According to a preferred embodiment of the method the hypothesis function ($h_\theta(x)$) is deduced using a neural network computational model. Neural network's ability to generalize and learn from the training dataset mimics, in some sense, human's ability to learn from experience. Neural networks are used for prediction and estimation problems. For a problem to be solved using neural networks, inputs that are well understood are needed. A good idea of which features are important for predicting the correct output is required. Such inputs may be easily available, but how to combine them will have to be decided. The next requirement is to have outputs that are well understood too, i.e. information about the kind of output that is desired to be estimated, predicted or modeled. For training the neural network we have samples of training set which have been obtained by experience. In these sample datasets both the inputs ("Features X") and the outputs (y) are known cases that are used to train the neural network.

The non-linear multi-dimensional nature of the neural-network allows it to better identify phenomena like nearby transformer saturation and its effect on the system fault level estimation.

According to a preferred embodiment of the invention the proposed "Features X" are voltage measurements (V) that are measured for a first 50 ms after the fault clearing event in steps of 5 ms and the reactive power exchange measurements ($Q_{ex}$) that are measured for a first 50 ms after the fault clearing event in steps of 5 ms. This will make the training examples or the training dataset more appropriate for close and correct estimation of fault level quickly after the fault clearing event, i.e. within 50 ms of the fault clearing event. Taking measurements in small steps of 5 ms will provide better and a finer training dataset for training the hypothesis function $h_\theta(x)$.

Due to the nature of the input proposed in the method, i.e. "Features X", for the application of neural networks, the time step length between measurements, e.g. 5 ms according to the preferred embodiment, and the length of the overall measurement, e.g. 50 ms according to the preferred embodiment, influence the number of inputs "Features X" to the neural network.

Table 1 below shows an exemplary training set assuming we have 'm' training examples available for the method using neural network computation model for estimation of fault level output 'y'. In this case the vector X is input variables given by "Features X"=$[X_0\ X_1\ X_2\ \ldots\ X_{20}]\in R^{20+1}$. The proposed "features X" involves measurements after the fault clearing event.

TABLE 1

| m (training example No.) | $X_1$ Voltage (kV) 5 ms after fault clearing | $X_2$ Voltage (kV) 10 ms after fault clearing | ... | $X_{10}$ Voltage (kV) 50 ms after fault clearing | $X_{11}$ $Q_{ex}$ (MVAR) 5 ms after fault clearing | $X_{12}$ $Q_{ex}$ (MVAR) 10 ms after fault clearing | ... | $X_{20}$ $Q_{ex}$ (MVAR) 50 ms after fault clearing | y (Fault level MVA) output) |
|---|---|---|---|---|---|---|---|---|---|
| 1 | 570.92 | 555.95 | ... | 489.27 | 550.21 | 430.83 | ... | −50.6 | 436 |
| 2 | 556.73 | 546.54 | ... | 496.26 | 524.85 | 418.31 | ... | −6.54 | 6004 |
| ... | ... | ... | ... | ... | ... | ... | ... | ... | ... |

TABLE 1-continued

|  | $X_1$ Voltage (kV) 5 ms after fault clearing | $X_2$ Voltage (kV) 10 ms after fault clearing | | $X_{10}$ Voltage (kV) 50 ms after fault clearing | $X_{11}$ $Q_{ex}$ (MVAR) 5 ms after fault clearing | $X_{12}$ $Q_{ex}$ (MVAR) 10 ms after fault clearing | | $X_{20}$ $Q_{ex}$ (MVAR) 50 ms after fault clearing | y (Fault level MVA) output) |
|---|---|---|---|---|---|---|---|---|---|
| m (training example No.) | | | | | | | | | |
| ... | ... | ... | ... | ... | ... | ... | ... | ... | ... |
| m | 589.46 | 591.72 | ... | 582.56 | 342.7 | 290.26 | ... | 375.46 | 5640 |

The first column has the number (m) of training samples used. The next set of columns contain the input variables "features X" which are derived from voltage (V) and reactive power exchange ($Q_{ex}$) measurements measured in steps of 5 ms for 50 ms after the clearance of the fault. The last column gives the correct output fault level (y). Table 1 provides only one sample training dataset used for training the hypothesis function $h_\theta(x)$. The above table is just a sample dataset. However, for different networks different samples are to be used for forming the corresponding dataset.

In an embodiment of the method, the neural network computational model comprises an input layer, at least one hidden layer and an output layer. The input layer comprises the input variable set, ("features X"=$[X_0 X_1 X_2 \ldots X_n]$). The hidden layer comprises activation units ($a_0, a_1, \ldots a_k$). The output layer comprises the corresponding system fault level output variable (y). In this neural network computational model of three layers, a first weight matrix ($\theta^{(1)}$) controls function mapping of the input variable set ($X=[X_0 X_2 \ldots X_n]$) of the input layer to the activation units ($a_0, a_1, \ldots a_k$) of the hidden layer and a second weight matrix ($\theta^{(2)}$) controls function mapping of the activation units ($a_0, a_1, \ldots a_k$) of the hidden layer to the corresponding system fault level output variable (y) of the output layer. The goal of the neural network is to estimate the fault level of the system (y) as a function of the neural network's weight matrices ($\theta^{(1)}, \theta^{(2)}$) with high accuracy, i.e $h_\theta(x) \approx y$, for all training examples.

There can be more than one hidden layer. In such a neural network there would be more than two weight matrices ($\theta^{(j)}$). The dimension of the matrix of weights ($\theta^{(j)}$) for each layer can be easily obtained, using the following rule. If a network has $S_j$ units in layer j and $S_k$ units in layer j+1, then the weight matrix $\theta^{(j)}$ will be of dimension $[S_k \times S_{j+1}]$.

The result of training the neural network is finding the internal weights matrices ($\theta^{(j)}$) which control function mapping from layer j to layer j+1 distributed throughout the network. Once the neural network is trained these weights matrices ($\theta^{(j)}$) are used to predict the fault level (y) of the system using the input variable, i.e. "features X".

In a preferred embodiment of the method, the structure of the neural network is a three layer neural network using 20 units ($X=[X_0 X_1 X_2 \ldots X_{20}]$) in the input layer, 8 units ($a_0, a_1, \ldots a_8$) in the hidden layer and one output layer (y).

The number of layers can vary as well as the number of units in the hidden layer. This will have an effect on the accuracy and computing power needed to train the neural network. The structure proposed in the above-mentioned preferred embodiment proves to be accurate to a large extent, while not requiring a lot of computing power to train. Other neural network structures may be used for improved accuracy.

In another embodiment of the method, the method further comprises a step of using Sigmoid function (g(z)) for deducing the hypothesis function ($h_\theta(x)$). The Sigmoid function (g(z)) is used as the activation function in the hidden layer, which is used for the calculation of the output of the neural network i.e. $h_\theta(x)$. The Sigmoid function is given by $$g(z) = \frac{1}{1+e^{-z}}.$$

The hypothesis function ($h_\theta(x)$) is formed using the Sigmoid function (g(z)) as an activation function where $h_\theta(x)=\theta^{(2)}\{g(\theta^{(1)}X)\}$, wherein the weight matrices ($\theta^{(1)}, \theta^{(2)}$) are determined by iteratively adjusting the weight matrices ($\theta^{(1)}, \theta^{(2)}$) to minimize a cost function (J(θ)). Given a set of inputs, i.e. input variables "Features X"=$[X_0 X_1 X_2 \ldots X_n] \in R^{n+1}$, and given the weight matrix ($\theta^{(j)}$) for each of the layers ($\theta^{(1)}, \theta^{(2)}$), the output of the neural network, i.e. the fault level estimation ($h_\theta(x)$), can be calculated using $h_\theta(x)=\theta^{(2)}\{g(\theta^{(1)}X)\}$.

The above mentioned cost function (J(θ)) is given by:

$$J(\theta) = \frac{1}{2m}\left[\sum_{i=1}^{m}(h_\theta(x^{(i)}) - y^{(i)})^2 + \frac{\lambda}{2m}\sum_{l+1}^{L-1}\sum_{i=1}^{sl}\sum_{j=1}^{sl+1}(\theta_{ji}^{(l)})^2\right],$$

where 'm' is the number of training examples, 'λ' is a regularization parameter to avoid over-fitting, 'L' is the total number of layers in the network and $s_l$ is the number of units in layer 'l', i.e. the input layer.

In a preferred embodiment, the parameters of the weight matrix ($\theta^{(j)}$) of each layer are adjusted by the neural network using a back-propagation algorithm, in order to minimize the average square error on the training set, i.e. to minimize the cost function, J(θ). Use of back-propagation algorithm enables the method to quickly and easily arrive at the best possible estimates of the weight matrices ($\theta^{(j)}$). However, there are other algorithms which can be used for the same purpose. Another example of such an algorithm is the conjugate gradient algorithm.

By using the proposed features, a neural network for this application can be trained to accurately estimate the fault level (y) after the fault clearing event in future, i.e. for samples it has never seen before in the training set.

Artificial neural networks allow for a multi-dimensional non-linear pattern recognition which as a result provides faster and more accurate estimations of the system fault level (y) after the fault clearing event.

According to the preferred embodiment mentioned earlier, the fault level can be accurately estimated using the first 50 ms measurements after the clearing of the fault. This gives a quick response of the fault level output variable (y), and this information can be used as a factor to adjust the controller parameters to the "new fault level" and obtain better dynamic performance.

The length of the measurements used for the "features X", i.e 50 ms according to the preferred embodiment, after the fault clearing event, influences the fault level estimation. The longer the measurements used, the more accurate is the prediction because the algorithm has more information to base its prediction on. Other measuring times can be used if they show better performance, what is important is that the accuracy of the predictions is acceptable, and that the prediction is available in time to improve the dynamic performance. The time steps used for the "features" definition (i.e in this case proposed 5 ms), influences the fault level estimation. Other time steps can be used if they show better performance, what is important is that the accuracy of the predictions must be acceptable. Using sufficient numbers of training examples helps the hypothesis function ($h_\theta(x)$) to arrive at an accurate result.

In an alternative embodiment of the method, the hypothesis function ($h_\theta(x)$) is deduced using a multivariate polynomial regression approach. It provides a simpler hypothesis function ($h_\theta(x)$) and easier calculation.

According to a preferred embodiment a second order polynomial is used. Different order polynomials can be used apart from the proposed 2nd order polynomial if better accuracy in the estimations is obtained. This depends on the training set and AC system network conditions which are project specific.

In a further embodiment the hypothesis function ($h_\theta(x)$) is defined as a function of the input variable set "features X" ($X=[X_0\ X_1\ X_2\ \ldots\ X_n]$) and theta parameters ($\theta=[\theta_0\ \theta_1\ \theta_2]$) represented as $h_\theta(x)=\theta_0+\theta_1 x+\theta_2 x^2$, wherein the theta parameters ($\theta=[\theta_0\ \theta_1\ \theta_2]$) are real numbers determined from a cost function ($J(\theta)$) by iteratively adjusting the theta parameters ($\theta=[\theta_0\ \theta_1\ \theta_2]$) to minimize the cost function ($J(\theta)$) using an optimization algorithm.

The theta parameters ($\theta=[\theta_0\ \theta_1\ \theta_2]\in R^{n+1}$) are "learned" by the regression algorithm in order to minimize the error between the correct answer "y" and the algorithm estimate $h_\theta(x)$, so that $h_\theta(x)\approx y$ for all training examples or training dataset of "features X".

The polynomial regression algorithm does not deliver accurate estimation when using the same input "features X" as the ones used for the neural network. Therefore, a new more refined feature needs to be used. For this purpose the "average change of voltage with respect to the reactive power", represented as "AvgVQ", is defined. For this purpose a measuring time "T" after the fault clearing event is defined, for example 60 ms. From the fault clearing instant to time "T" a number "mes" of measurements are saved with equal spacing of "$\zeta$" milliseconds. The "average change of voltage with respect to the reactive power" (AvgVQ) is given by:

$$AvgVQ = \int_0^T \frac{1}{mes}\sum_{i=1}^{mes}\{(V_{(t-[i-1]\zeta)} - V_{(t-i\zeta)})/(Q_{ex(t-[i-1]\zeta)} - Q_{ex(t-i\zeta)})\},$$

where, 'mes' is the number of measurements considered for the averaging and '$\zeta$' is the time spacing between those measurements. 'V' is the voltage and '$Q_{ex}$' is the reactive power exchange measurements measured after the fault clearing event.

Furthermore, within the measuring time "T" the variables "$\alpha 1$" and "$\alpha 2$" are defined as the time the voltage at the desired bus bar remains above 1.15 pu and 1.2 pu respectively. This invention proposes the following as "feature X" to be used as an input for the Polynomial regression approach:

$$X_1 = AvgVQ(e^{c\cdot\alpha 1} + e^{d\cdot\alpha 2}),$$

where 'c' and 'd' are constants that can be varied project specifically to obtain better results Table 2 shows an exemplary training set for the second order polynomial regression approach for fault level estimation, assuming we have 'm' training examples available.

TABLE 2

| m (training example no.) | X (feature 1) | X^2 (feature 2) | y (fault level MVA) output |
|---|---|---|---|
| 1 | 7.45 | 56.1 | 8622 |
| 2 | 6.8 | 46.54 | 8096 |
| ... | ... | ... | ... |
| ... | ... | ... | ... |
| m | 6.63 | 43.95 | 4211 |

The goal of the polynomial regression approach is to iteratively adjust theta parameters ($\theta=[\theta_0\ \theta_1\ \theta_2]\in R^{n+1}$) in order to minimize the cost function $J(\theta)$ defined as the average squared error using an optimization algorithm. The cost function is defined as:

$$J(\theta) = \frac{1}{2m}\left[\sum_{i=1}^{m}(h_\theta(x^{(i)}) - y^{(i)})^2 + \lambda\sum_{j=1}^{n}\theta_j^2\right],$$

where 'm' is the number of training examples, '$\lambda$' is the regularization parameter which can be adjusted to avoid overfitting problems and 'n' is the number of "features X".

The proposed "features X" described above involve measurements after the fault clearing event, therefore some form of fault detection is required so that once the fault is cleared the measurements required for the input "features X" can start. This invention proposes the use of under-voltage detection, for example when voltage is below 0.8 pu, to flag a fault incident in the AC network and trigger the polynomial regression fault level estimation after the fault clearing event. Any other fault detection method can also be used as mentioned earlier.

By using the proposed feature, a set of theta parameters ($\theta=[\theta_0\ \theta_1\ \theta_2]\in R^{n+1}$) for this application can be trained to accurately estimate the fault level quickly after the fault clearing event for examples it has never seen before in the training set.

According to a further embodiment, the optimization algorithm is gradient descent algorithm. It is a first-order optimization algorithm. However, any other optimization algorithm can also be used for the same purpose.

According to an embodiment of the method, the cost function ($J(\theta)$) is a measure of error in estimating the system fault level obtained from the learning algorithm ($h_\theta(x)$) compared to the corresponding system fault level output variable (y). The cost function ($J(\theta)$) helps in aligning the method to predict the output fault level more accurately by training the learning algorithm ($h_\theta(x)$).

The supervised learning method disclosed in this invention, i.e. using the neural network computational model or the polynomial regression approach, can be trained offline during detail design so that the resulting weight matrices ($\theta^{(j)}$) for the neural network or the theta parameters ($\theta$) in case of polynomial regression, can be used and tested during commissioning. More importantly, the hypothesis function ($h_\theta(x)$) can be retrained during commercial operation of the converter, using real life measurements.

In this way a highly adaptive dynamic performance of the converter can be achieved. Unexpected future AC system conditions that were not taken into account in the design can be "learned" and identified by the algorithms in order to guarantee dynamic performance, even in unforeseen future scenarios thanks to its learning abilities.

The above-mentioned and other features of the invention will now be addressed with reference to the accompanying drawings of the present invention. The illustrated embodiments are intended to illustrate, but not limit the invention. The drawings contain the following figures, in which like numbers refer to like parts, throughout the description and drawing.

DESCRIPTION OF THE INVENTION

Figure 1:
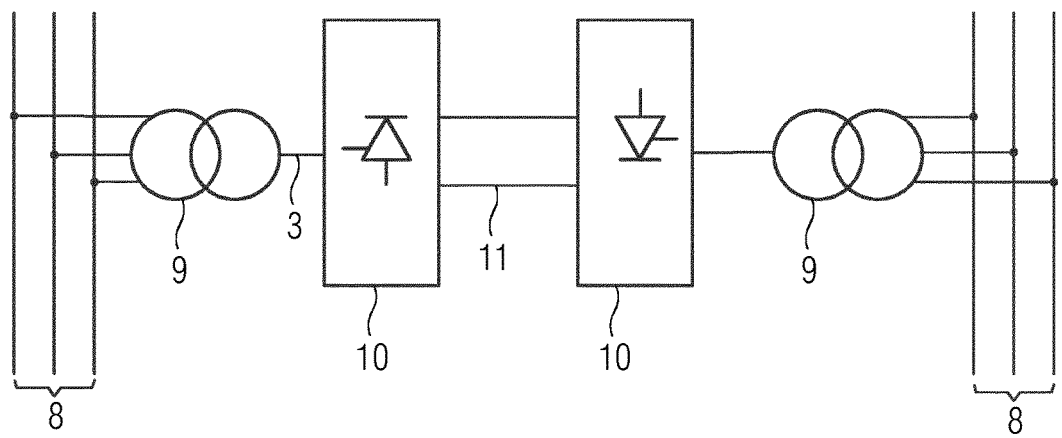
FIG. 1 is a schematic diagram showing an HVDC transmission system having converter stations fitted with power converters.

As seen in FIG. 1, the AC grids 8 are connected to the converter stations 10 via transformers 9. The bus bar 3 connects the converter stations 10 to their corresponding AC grid 8. The converter station 10 at the transmission side is connected to the converter station 10 at the receiving side via DC transmission line 11. The transmission of power takes place over large distances through the DC line 11. The converter station 10 comprises of power converters 1 (not shown in FIG. 1).

Figure 2:
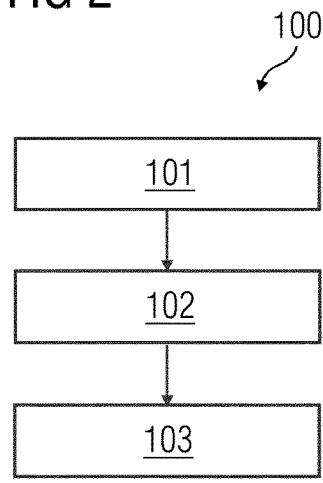
FIG. 2 shows a flowchart containing the steps according to the disclosed method.

FIG. 2 displays the steps to be carried out for fault level estimation for a power converter 1 quickly after a fault clearing event. The method 100 comprises a first step 101 of providing a training dataset comprising an input variable set ($X=[X_0\ X_1\ X_2\ \ldots\ X_n]$) and a corresponding system fault level output variable (y). The method 100 comprises a second step 102 of deducing a hypothesis function ($h_\theta(x)$) based on the training dataset. Thereafter a third step 103 of estimating the system fault level quickly after the fault clearing event using the hypothesis function ($h_\theta(x)$) is carried out.

The method 100 presented in this invention allows for fast and accurate fault level estimation (y) shortly after a fault clearing event.

The above method is useful, for example, in case of a classical line commutated converter (LCC) HVDC not having a reliable fault level estimation after a severe system contingency can lead to repetitive commutation failure during DC power recovery after the fault clearing event. This can be avoided using the fault level estimation from the above disclosed method. For example 50 ms after the fault clearing event, the "new" fault level estimation will be available, and it can be used to determine whether the AC system is strong enough to support DC power recovery to the pre-fault values. If this is not the case, a DC current limitation can be quickly carried out, to avoid commutation failures.

Figure 3:
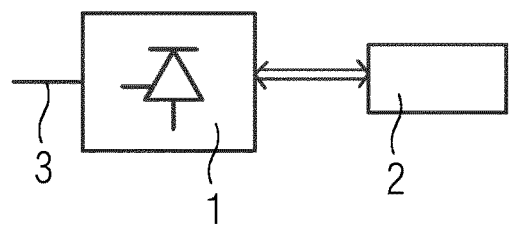
FIG. 3 depicts a block diagram of a power converter and a controller of the power converter.

FIG. 3 displays a block diagram of a power converter 1 and its controller 2. Each power converter 1 has its corresponding controller 2 through which the power converter 1 is controlled. The estimated fault level output (y) is useful to change or optimize the controller 2 parameters in order to achieve a better performance during system dynamics, eg. rise time, settling time, maximum overshoot etc.

The input variable set ($X=[X_0\ X_1\ X_2\ \ldots\ X_n]$) is derived from voltage measurements (V) and/or reactive power exchange measurements ($Q_{ex}$) after the fault clearing event. And these measurements (v, Q) are measured at a desired bus bar 3 connected to the power converter 1.

Based on the training dataset, the hypothesis function ($h_\theta(x)$) learns to accurately predict the fault level (y) in future when a fault clearing event occurs. The changed strength of system bus bars immediately after a fault clearing event can affect the performance of the system adversely. This method 100 will ensure that the system adapts to the new system conditions and gives improved dynamic performance even post a fault clearing event.

Figure 4:
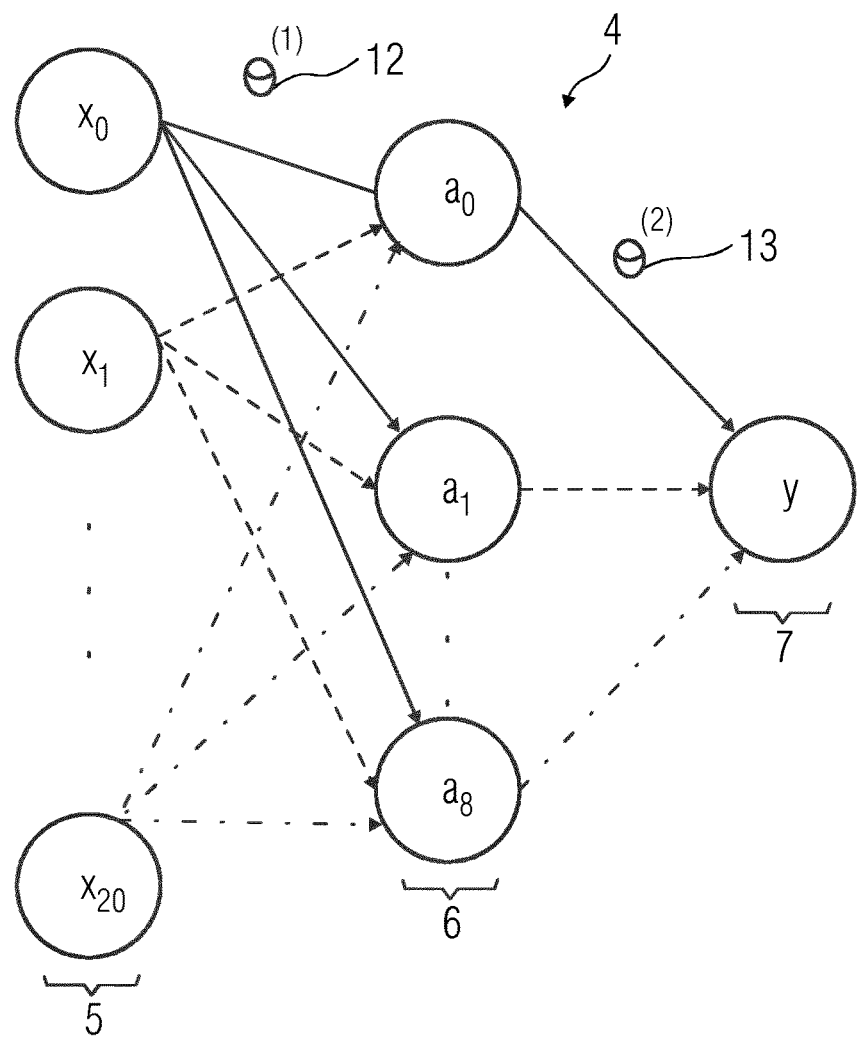
FIG. 4 shows an exemplary neural network computational model according to the disclosed method.

FIG. 4 shows an exemplary neural network computational model 4 according to the disclosed method. In this exemplary model 4 the structure of the neural network is a three layer neural network. The first layer is the input layer 5 comprising 20+1 units, including a bias unit, ($X=[X_0\ X_1\ X_2\ \ldots\ X_{20}]$). The second layer is the hidden layer 6 which uses 8+1 units, including a bias unit, ($a_0, a_1, \ldots, a_8$) according to FIG. 4. The units of the hidden layer 6 are also called as activation units. And the third layer is the output layer 7 having only 1 unit (y).

A first weight matrix 12 ($\theta^{(1)}$) controls function mapping of the input variable set ($X=[X_0\ X_1\ X_2\ \ldots\ X_n]$) of the input layer 5 to the activation units ($a_0, a_1, \ldots, a_k$) of the hidden layer 6 and a second weight matrix ($\theta^{(2)}$) controls function mapping of the activation units ($a_0, a_1, \ldots, a_k$) of the hidden layer 6 to the corresponding system fault level output variable (y) of the output layer 7. FIG. 4 shows only an example of a neural network model, other neural network models with different number of units in each layer and different number of layers can also be created for the same purpose.

Although the invention has been described with reference to specific embodiments, this description is not meant to be construed in a limiting sense. Various modifications of the disclosed embodiments, as well as alternate embodiments of the invention, will become apparent to persons skilled in the art upon reference to the description of the invention. It is therefore contemplated that such modifications can be made without departing from the embodiments of the present invention as defined.

LIST OF REFERENCE NUMBERS 1 power converter
2 controller
3 bus bar
4 neural network computational model
5 input layer
6 hidden layer
7 output layer
8 AC grid
9 transformer
10 converter station 11 DC transmission line
12 first weight matrix $\theta^{(1)}$
13 second weight matrix $\theta^{(2)}$
100 method
101 a step of providing a training dataset
102 a step of deducing a hypothesis function
103 a step of estimating the system fault level

The invention claimed is:

1. A method for system fault level estimation for a power converter after a fault clearing event, the method comprising the following steps:
   providing a training dataset having an input variable set and a corresponding system fault level output variable;
   deducing a hypothesis function based on the training dataset;
   estimating the system fault level after the fault clearing event using the hypothesis function, wherein the fault clearing event includes tripping equipment due to a fault; and
   adjusting controller parameters based on the system fault level that has been estimated.

2. The method according to claim 1, which further comprises deriving the input variable set from voltage measurements and reactive power exchange measurements after the fault clearing event.

3. The method according to claim 2, which further comprises taking the voltage measurements and the reactive power exchange measurements at a bus bar connected to the power converter.

4. The method according to claim 2, which further comprises conducting the voltage measurements for at least first 50 ms after the fault clearing event in steps of 5 ms.

5. The method according to claim 2, which further comprises conducting the reactive power exchange measurements for at least first 50 ms after the fault clearing event in steps of 5 ms.

6. The method according to claim 1, wherein the step of deducing the hypothesis function comprises using a neural network computational model.

7. The method according to any claim 6, wherein the neural network computational model comprises:
   an input layer with the input variable set;
   at least one hidden layer with activation units; and
   an output layer with a corresponding system fault level output variable;
   a first weight matrix controlling function mapping of the input variable set of the input layer to the activation units of the hidden layer and a second weight matrix controlling function mapping of the activation units of the hidden layer to the corresponding system fault level output variable of the output layer.

8. The method according to claim 7, further comprising a step of using a Sigmoid function $$g(z) = \frac{1}{1 + e^{-z}}$$

for deducing the hypothesis function, where $$h_\theta(x) = \theta^{(2)}\{g(\theta^{(1)}X)\},$$

$\theta^{(1)}$ is the first weight matrix,
   $\theta^{(2)}$ is the second weight matrix, and
   determining the weight matrices $\theta^{(1)}$, $\theta^{(2)}$ by iteratively adjusting the weight matrices to minimize a cost function.

9. The method according to claim 8, which further comprises determining the weight matrices $\theta^{(1)}$ and $\theta^{(2)}$ by iteratively adjusting the weight matrices using a backpropagation algorithm.

10. The method according to claim 8, wherein the cost function is a measure of error in estimating the system fault level obtained from the learning algorithm compared to the corresponding system fault level output variable.

11. The method according to claim 1, which further comprises deducing the hypothesis function using a multivariate polynomial regression approach.

12. The method according to claim 11, wherein the hypothesis function is defined as a function of the input variable set $X=[X_0\ X_1\ X_2\ \ldots\ X_n]$ and theta parameters $\theta=[\theta_0\ \theta_1\ \theta_2]$ given by:

$$h_e(X) = \theta_0 + \theta_1 X + \theta_2 X^2,$$

wherein the theta parameters $\theta=[\theta_0\ \theta_1\ \theta_2]$ are real numbers determined from a cost function by iteratively adjusting the theta parameters to minimize the cost function using an optimization algorithm.

13. The method according to claim 12, wherein the optimization algorithm is a gradient descent algorithm.

14. The method according to claim 1, further comprising a step of adjusting controller parameters of the power converter based on the system fault level estimation.

15. The method according to claim 1, which further comprises detecting the fault clearing event by an undervoltage condition.

* * * * *